exposed surface area of the first set of conductive leads 13 as illustrated in FIG. 7. A layer 31 of a photosensitive resistant material which may be of the same type as that previously employed is deposited on the surface of the aluminum layer 30. A mask 32 having opaque and transparent 33 regions is positioned over the photosensitive resistant material. The transparent regions 33 of the mask 32 delineate the pattern of the second set of conductive leads.

The masked wafer is subjected to ultraviolet light polymerizing the photosensitive resistant material underlying the transparent regions of the mask 32. The mask is removed and the assembly is rinsed in a developing solution to wash away the resistant material which was not exposed to light.

The exposed aluminum is then etched away as by spraying the assembly for a period of about 2 minutes with an aqueous solution of sodium hydroxide, or an aqueous solution of phosphoric and nitric acids as employed previously. The etching solution dissolves aluminum but does not attack the resistant material or the silicon oxide. Thus, the exposed aluminum is removed, while the portions of the second aluminum layer covered by the overlying protective material 31 are not disturbed. The protective material is then dissolved by rinsing in a suitable solvent to provide the resulting assembly as illustrated in FIG. 8. The assembly is then heated to cause alloying of the aluminum in the openings 12 in the first coating 11 of silicon oxide with the underlying silicon thereby forming ohmic contacts between the regions of the silicon wafer and the conductive leads.

As can be seen from FIG. 8, the pattern of conductive leads of a semiconductor device may be formed in sets, or layers, with cross-overs 35 or interconnections 36 between the sets provided as desired by the absence or presents of openings 26 in the intervening layer 20 of non-conductive material. Since the material of the intervening non-conductive layer 20 is the same as, or closely related to, the protective coating 11 over the silicon, there is excellent physical and chemical compatibility between the various materials of the device. That is, good adhesion is obtained between the two non-conductive layers, and the intervening non-conductive layer does not contain material which might cause contamination of the device. In addition, the material of the intervening layer is stable at extremely high temperatures.

In a typical example in accordance with the invention a layer 13 of aluminum 5,000 angstrom units thick was deposited on a silicon oxide coating 11 and in openings 12 in the coating exposing surface areas of a wafer 10 of silicon. The first set of conductive leads was formed from the aluminum layer by the photosensitive resist masking and chemical etching procedures described above. Then, a layer 20 of silicon oxide approximately 7,200 angstrom units thick was deposited on the wafer by reacting $SiH_4$ with oxygen at the surface of the wafer. Protective masking material 21 was placed on the surface of predetermined portions of the oxide layer 20 by known techniques as described.

Next, the assembly was subjected to an etching solution of hydrofluoric acid, ammonium flouride, and a water-soluble alcohol. The etching solution included a mixture of aqueous solutions of ammonium fluoride and hydrogen fluoride combined with methyl alcohol. The mixture consisted essentially of 9 parts by weight of a 40 percent by weight ammonium fluoride aqueous solution and 1 part by weight of a 48 percent by weight hydrogen fluoride aqueous solution. This mixture was combined with an equal volume of methyl alcohol to produce the etching solution employed. This etching solution etched through the silicon oxide layer 20 in approximately 4 minutes, or at an etching rate of about 1800 angstrom units per minute. The etching solution did not attack the aluminum other than to perform a slight cleaning action.

After the assembly was treated in the etching solution, a layer 30 of aluminum 10,000 angstrom units thick was deposited on the surface of the silicon oxide layer 20 and on the portion of the first set of leads 13 exposed at the openings 26 in the silicon oxide layer. The second set of conductive leads was formed from the aluminum layer by the photosensitive resist masking and chemical etching procedures previously described. After formation of the leads, and removal of the protective material, the assembly was heated to alloy the aluminum to the silicon at the openings 12 in the first oxide coating 11.

The method of the invention has also been carried out by employing the above-mentioned mixture of ammonium fluoride and hydrogen fluoride in combination with other water-soluble alcohols in different proportions to etch openings in silicon oxide layers. The following table shows the etching rate of various solutions on silicon oxide.

| Percent by Volume of Mixture of 1 Part by Weight of 48 Percent by Weight Hydrogen Fluoride Aqueous solution and 9 Parts by Weight of 40 Percent by Weight Ammonium Fluoride Aqueous Solution | Alcohol | Percent by Volume of Alcohol | Etching Rate on Silicon Oxide, in Angstrom Units per Minute |
|---|---|---|---|
| 75 | Methyl alcohol | 25 | 2,060 |
| 25 | do | 75 | 1,800 |
| 75 | Isopropyl alcohol | 25 | 1,920 |
| 50 | do | 50 | 1,800 |
| 25 | do | 75 | 1,700 |
| 75 | Ethyl alcohol | 25 | 2,200 |
| 50 | do | 50 | 1,975 |
| 25 | do | 75 | 1,360 |
| 75 | n-Butyl alcohol | 25 | 2,480 |
| 50 | do | 50 | 2,320 |
| 25 | do | 75 | 1,800 |
| 75 | Ethylene glycol | 25 | 2,200 |
| 50 | do | 50 | 1,230 |
| 25 | do | 75 | 990 |

The etching solutions as described have also been employed in carrying out the method of the invention when silica glasses have been used as the non-conductive material between the two sets of conductive leads. For example, the following table shows the etching rate of various solutions on alumina-boro-silicate glass.

| Percent by Volume of Mixture of 1 Part by Weight of 48 Percent by Weight Hydrogen Fluoride Aqueous Solution and 9 Parts by Weight of 40 Percent by Weight Ammonium Fluoride Aqueous Solution | Alcohol | Percent by Volume of Alcohol | Etching Rate on Alumina-Boro-Silicate Glass, in Angstrom Units per Minute |
|---|---|---|---|
| 25 | Isopropyl alcohol | 75 | 320 |
| 50 | n-Butyl alcohol | 50 | 820 |
| 50 | Ethylene glycol | 50 | 420 |

It has been found that the foregoing solutions each silicon oxide and silica glasess without significantly attacking aluminum. Apparently the presence of the alcohol in the solution reduces the proportion of water so that the solution does not effectively oxidize aluminum. Since the formation of oxides is the first of several reactions which must occur in order to remove the metal, the metal is substantially unaffected by the solution. Similarly, these etching solutions do not attack other metals which oxidize to form refractory oxides.

It has also been found that these solutions having a significant alcohol content show no shift in the concentration of fluoride ions during the etching process. Thus, the etching rate remains fairly constant; and, therefore, more controllable. This result is believed to be caused by the polarizing action of the alcohol which action appears to be very similar to that obtained from aqueous solutions. Of the alcohols specifically mentioned thereinabove, methyl alcohol is particularly effective in this respect.

METHOD FOR WELDING PLASTIC MEMBERS

United States Patent Office 3,518,136
Patented June 30, 1970

3,518,136

METHOD FOR WELDING PLASTIC MEMBERS

Eiji Mori, 10–35 2-chome, Ohokayama Meguro-ku, Tokyo, Japan; Masao Ide, 15–18 1-chome, Ishikawa-machi, Ohta-ku, Tokyo, Japan; and Seiji Kaneko, 187 1-chome, Kamiochiai Shinjuku-ku, Tokyo, Japan Filed Oct. 13, 1967, Ser. No. 675,109
Claims priority, application Japan, Oct. 19, 1966, 41/68,309, 41/68,310; Mar. 22, 1967, 42/17,606
Int. Cl. B29c *27/08*
U.S. Cl. 156—73 5 Claims

ABSTRACT OF THE DISCLOSURE

A method for welding plastic members comprises passing ultrasonic waves of a frequency above 100,000 cycles per second through a liquid medium wherein the waves are focused onto the surfaces of plastic members to be welded, there being a liquid film in contact with the surface of one of the plastic members through which the waves are propagated.

Figure 4:
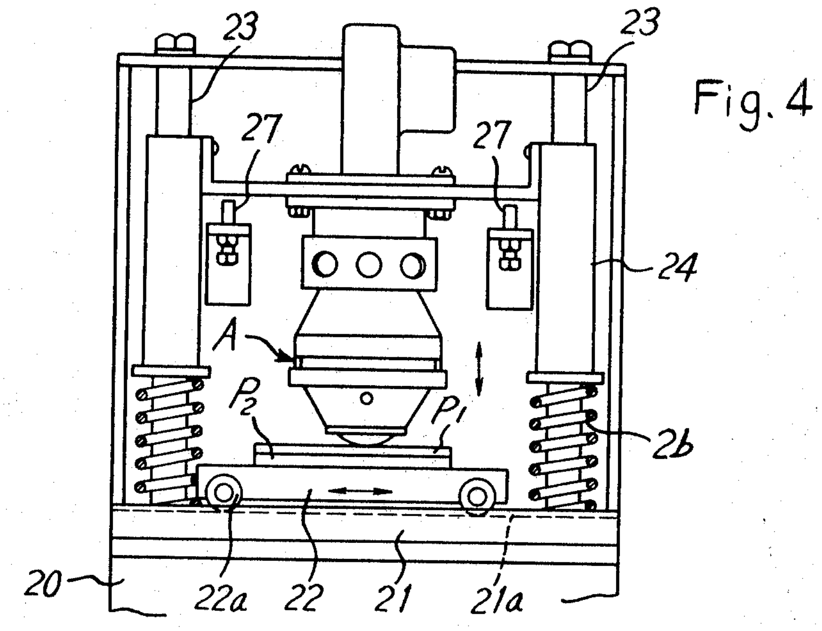

The invention relates to a method of welding plastic members by a focused beam of ultrasonic waves and apparatus for carrying out the method.

The use of ultrasonic waves for welding plastic members has been already known, and most conventionally, ultrasonics having a frequency in the order of 20 kilocycles per second are used to excite a metal vibrating horn which is directly urged under pressure against the surface of a plastic member to be joined with another. However, with such welding technique, it has been impossible to avoid formation of scars or distortion on the surface of the member which contacts the horn, particularly when the members to be worked are of soft plastic materials.

Therefore, it is an object of the inevntion to provide a method and apparatus for welding plastic members to be joined at the contact surface therebetween by using ultrasonic frequencies and without leaving any scar or distortion on the external surface of the members worked.

It is a specific object of the invention to provide means for efficiently transmitting a focused beam of ultrasonic waves to the contact surface between plastic members to be welded.

Another object is to provide a method whereby ultrasonic waves can be efficiently transmitted to and absorbed by members to be worked.

Still another object of the invention is to provide a method for obtaining uniform welding of members to be joined thorughout the area of contact therebetween.

These objects are achieved in accordance with the invention by using ultrasonic frequencies of substantially higher frequency than that usually employed in the prior art. Generally, the velocity of sound in plastic materials ranges from hundreds to thousands of meters per second so that a sound wave applied to a plastic material and having a frequency in the range of one hundred kilocycles to ten megacycles per second will have a wavelength in the interior of plastic material which is of the order of millimeters or less, with consequence that it obtains an appreciable directivity. Thus the invention proposes to focus ultrasonic waves of a frequency within the above range to the interior or surface of a plastic member so as to produce a sharp focal zone having a high density of accoustic energy, thereby limiting the area where heat is produced to the focal zone.

Ultrasonic waves used according to the invention should desirably have a high frequency above one hundred kilocycles per second to ensure maximum absorption by plastic members to be worked and positive focusing to achieve a sharp focal zone. Suitable vibrators for this purpose can be formed from various known materials capable of being excited to effect resonance at such high frequency; for example, electro-strictive materials such as barium titanate and lead zirconate, or piezoelectric materials such as quartz. Below one hundred kilocycles, there occurs a difficulty of efficiency focusing ultrasonic waves. The upper limit of the frequency range is principally determined by the availability of the vibrator materials and the construction requirements for mechanical strength.

In accordance with the invention, liquid is used as a medium for transmitting ultrasonic waves produced by the vibrator. This overcomes another disadvantage of the prior art when a metal horn is employed as the transmission medium. It was found that the metal horn had complex modes of its vibration to thereby make it difficult to produce an effective focal zone, while substantially no disturbance of focusing was observed with a liquid medium. Another advantage provided by the use of a liquid medium is that the wavelength of the ultrasonic waves used does not impose restrictions on the dimension of arrangement of the medium as it does in the metal horn. This is because a metal horn has a high acoustic impedance and consequently requires to be used in a configuration which achieves resonance. Furthermore, the liquid medium provides a cooling effect to the members to be worked. Although the reason that members worked with the invention have no scars or distortion formed on the external surface thereof may be considered partly due to incomplete focusing of the ultrasonic waves at the surface of the member with the result that excessive concentration of stress does not occur at this place, it is also believed that the cooling effect provided by the liquid medium partly contributes to the achievement of the above result.

Figure 3:
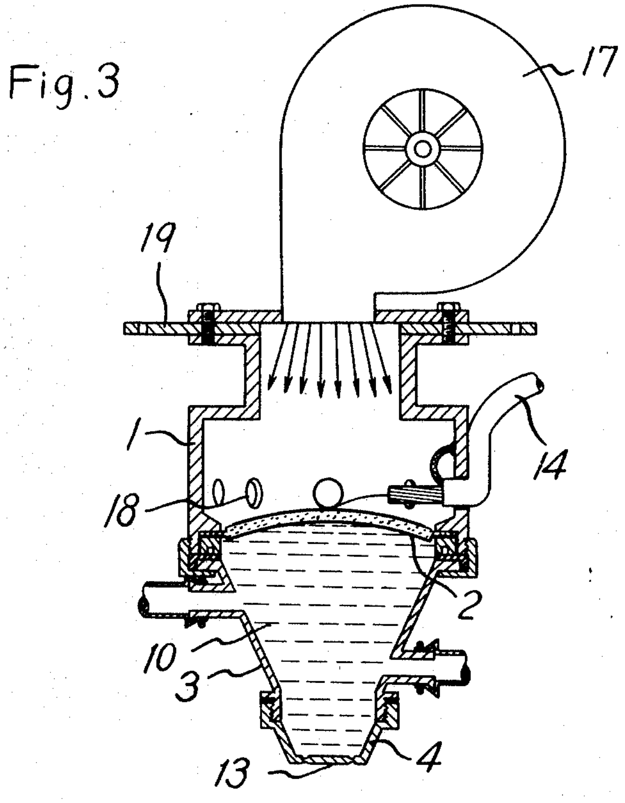
Figure 5:
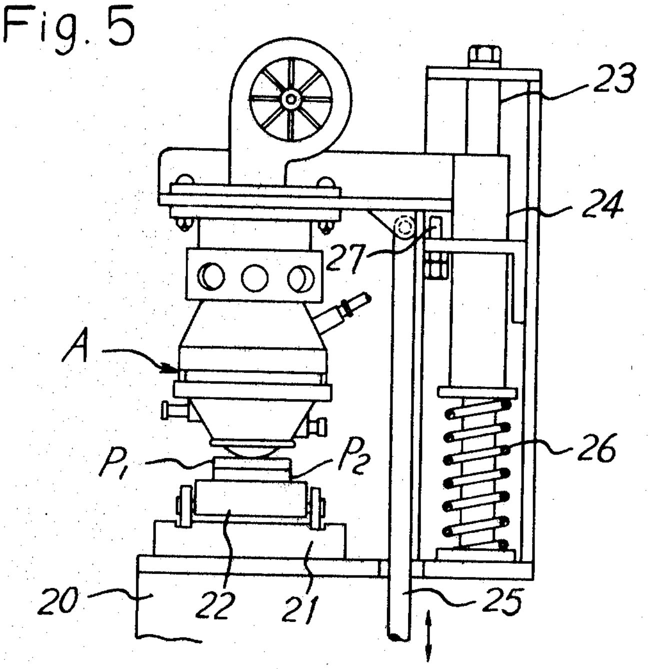
Figure 6:
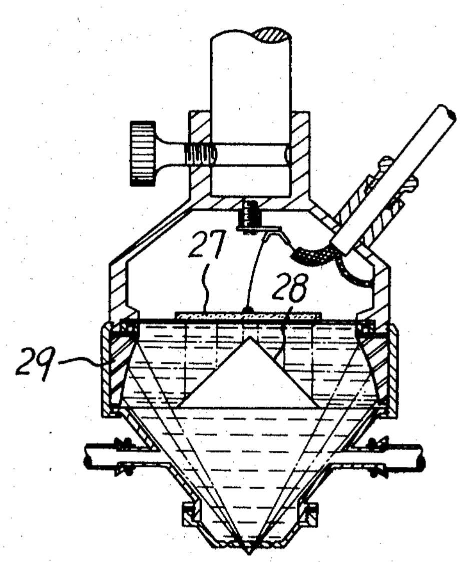
Figure 7:
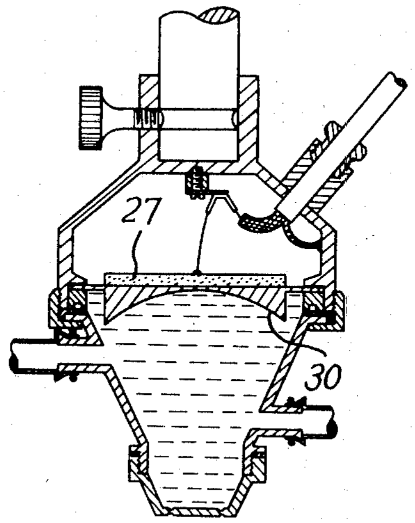
Figure 8:
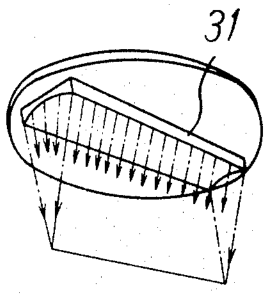
Figure 10A:
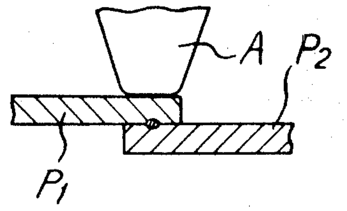
Figure 10B:
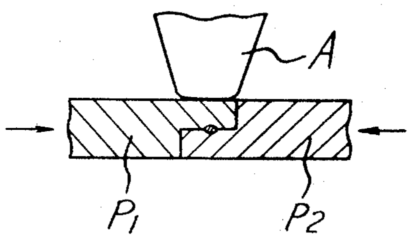
Figure 9:
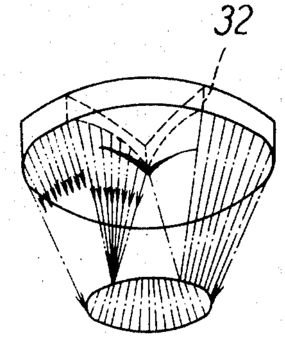
Figure 10C:
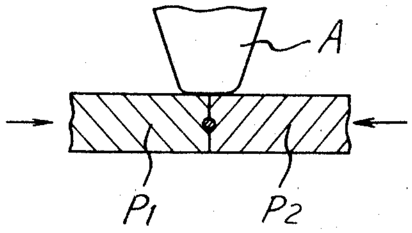
Figure 11:
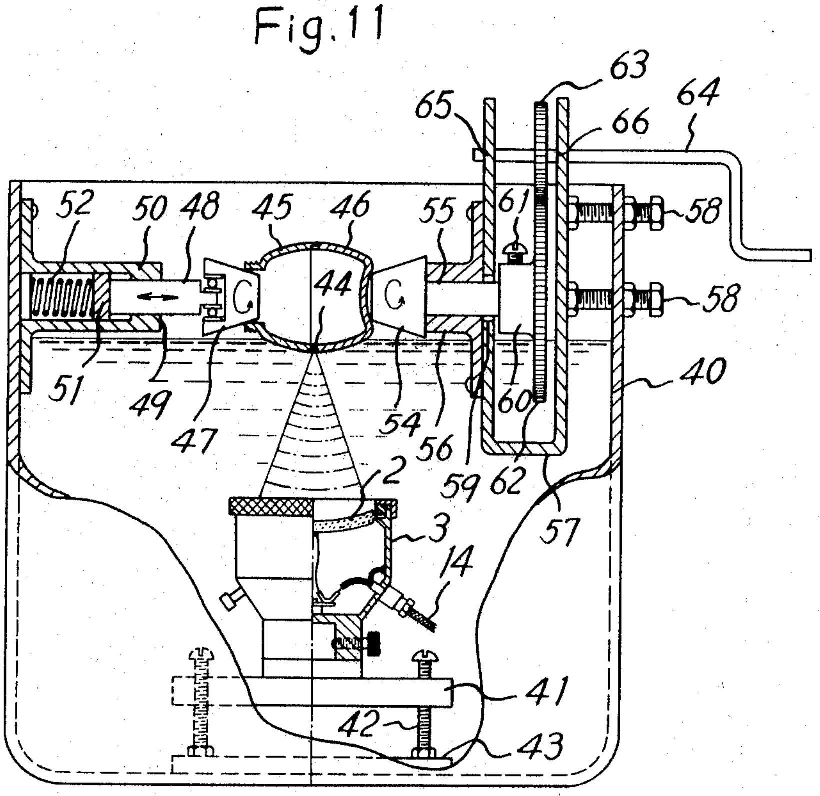
Figure 12:
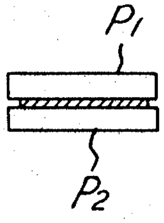

The above and other objects, features and advantages of the invention will become apparent from the following description of several embodiments thereof shown in the drawing wherein:

FIG. 1 is a view showing the exterior of an ultrasonic wave generating and focusing apparatus in accordance with one embodiment of the invention, FIG. 2*a* is a longitudinal section of the apparatus shown in FIG. 1, FIG. 2*b* is a fragmentary view of the apparatus illustrating a modification of a part thereof, FIG. 3 is an elevation, partly in longitudinal section, of the apparatus combined with a forced cooling means, the latter being a fan shown schematically, FIG. 4 is a front elevation of a welding system incorporating the ultrasonic wave generating and focusing apparatus of the invention shown in FIG. 3, FIG. 5 is a side elevation of the system shown in FIG. 4, FIGS. 6 to 9 show various forms of focusing devices, and particularly FIG. 6 shows a reflection type using an optical prism, FIG. 7 a form using a plastics lens, FIG. 8 an arrangement for producing a linear focus, and FIG. 9 another arrangement for producing a circular focus, FIGS. 10*a* to 10*c* show various welding positions of plastic members to which the method of the invention can be applied, FIG. 11 shows, partly broken away and in section, another welding system incorporating the apparatus of the invention which may be used to carry out an alternative method of the invention, and FIG. 12 is a view illustrating a further teaching of the invention for improving uniformity of welding.

It should be noted that in the drawing like parts are designated by same reference characters.

Referring to the drawing, and particularly FIGS. 1, 2*a* and 2*b*, there is shown one embodiment of an ultrasonic wave generating and focusing apparatus, generally shown at A, which may be used for carrying out the method of the invention. The apparatus A comprises a body 1 which supports a vibrator 2 in the form of a part of a sphere. The vibrator 2 has both its upper and lower surfaces coated with conductive materials such as silver or nickel to thereby form electrodes 2*a*, 2*b* for the mode of vibration in the direction of thickness. Because of its shape, the vibrator itself acts as a focusing means for ultrasonic waves. The apparatus further comprises a vessel 3 closed at the bottom by a cap member 4. The vessel is filled with a liquid medium for transmitting ultrasonic frequencies produced by the vibrator 2. The body 1 has an inward, annular flange 5 adjacent its bottom and the peripheral edge of the vibrator 2 is pressed against the flange 5 by a snap ring 6. The vessel 3 is connected at its top to the body in a fluid-tight manner. To this end, the top flange 3*a* of vessel is held against the bottom of the body 1 through a fluid-tight packing 7 by means of a connecting ring 8. The vessel is generally of frusto-conical shape and has a cylindrical bottom portion which is threaded for threadable engagement with the cap member 4. In order to hydraulically and pneumatically seal the vessel so that liquid medium is confined void-free in the space defined by the vibrator 2, the vessel 3 and the cap member 4, an annular fluid-tight packing 9 is placed between the upper end of the threaded portion of the cap member 4 and an external flange 3*b* provided at the top of the cylindrical portion of the vessel 3.

Liquid medium 10 filled in the vessel 3 should be deaerated liquid such as deaerated water or deaerated oil which does not cause or suppresses cavitation phenomenon upon propagation of ultrasonic frequencies therethrough. When filled, liquid medium 10 must be void-free within the vessel 3. Air bubbles may remain on the inner wall of the vibrator or the vessel, and in order to remove such air bubbles, the liquid may be filled to overflow so that bubbles are carried away by forced flow of liquid. Water may be boiled, subjected to evacuation or shaking before being filled in the vessel 3. The liquid medium thus processed must be sealed from contact with atmosphere or other gas for a prolonged time.

Additionally, the liquid medium should have an acoustic impedance approaching that of the plastic members to be worked. Liquid medium is supplied to the vessel 3 through an inlet port 11 and displaced therefrom through an outlet port 12, these ports 11, 12 being usually closed by suitable valves (not shown). The cap member 4 has its bottom formed by a thin metal plate 13 which is soldered to the lower end of the frusto-conical wall of the cap member 4. The purpose of this bottom plate is to transmit ultrasonic waves which are propagated through liquid medium 10 to an underlying plastic member to be worked. Therefore, minimum transmission loss of ultrasonic waves and proper mechanical strength to withstand shocks exerted by the ultrasonic waves are two fundamental requirements for the bottom plate. Film or cloth made from organic materials is unsatisfactory, because they are liable to be fractured when subject to ultransonic frequencies. For this reason, a thin metal plate is chosen for the bottom plate, and its thickness is made as small as possible so long as it is compatible with the mechanical strength requirement. Preferably the thin metal plate has a thickness which corresponds to half the wavelength of an ultrasonic wave used, as seen at plate 13 in FIG. 2*a*, or it may have a thickness in the range from 0.03 to 0.1 mm., as shown in FIG. 2*b* by the plate 13'. Such numerical values for the thickness of the thin metal plate have been found to be practical for the purpose of the invention.

The vibrator 2 may be of any known material which is capable of producing ultrasonic waves at a frequency above one hundred kilocycles per second. When it is made from an electrostrictive or piezoelectric material as mentioned previously, electric power for excitation of the vibrator 2 is provided through a high frequency cable 14 connected to a suitable voltage source not shown, one lead of the cable being connected to the electrode 2*a* and the other to the body 1 which is connected mechanically and electrically with the electrode 2*b* of the vibrator 2, the latter being thus grounded. The body 1 has a cylindrical part at the top for connection with a mounting stub 15 and is secured thereto by suitable means such as set screw 16.

In the embodiment shown in FIG. 3, the ultrasonic wave generating and focusing apparatus is generally similar to that shown in FIG. 2, but has a blower 17 associated therewith for forced cooling of the spherical vibrator 2. It will be noted that in this case, the body 1 has holes 18 formed therein for exhaust of air flow. Also the apparatus is shown to be secured to a mounting plate 19 in place of the mounting stub 15 shown in FIG. 2*a*.

Now with reference to FIGS. 4 and 5, an operation for welding two flat, plastic plates at the surface of face-to-face contact by using a welding system constructed in accordance with the invention will be described. The system incorporates the apparatus shown in FIG. 3 which is designated in FIGS. 4 and 5 by reference character A. The system further includes a cradle for members to be worked and a support assembly for the apparatus.

Specifically, there is provided a base 20 on which is mounted a stool 21 having a pair of guide grooves 21*a* formed in the upper surface thereof. A table 22 is placed on the stool 21 with its carrying rollers 22*a* engaging with the grooves 21*a*, so that the table 22 provides a slidable cradle for members to be worked. Vertically mounted on the base 20 and spaced apart are a pair of posts 23 to which is secured a framework 24 which in turn carries the apparatus A in opposed relationship with respect to the cradle 22. The framework 24 loosely fits around the posts 23 and can be raised or lowered by the vertical movement of an operating rod 25 connected thereto. Between the framework 24 and the stool 21, springs 26 are wound around the posts 23. A pair of stops 27 are arranged so that minimum clearance can be maintained between the lower end of the apparatus A and the cradle.

In operation, plastic plates $P_1$ and $P_2$ to be joined are placed one on another on the cradle 22. The ultrasonic wave generating and focusing apparatus A is adjusted so that when its lower end or the thin metal plate 13 at the bottom of the cap member 4 is brought into contact with the upper surface of the upper member $P_1$, the beam of ultrasonic waves is focused at a location of welding, that is, at the surface of contact between the members $P_1$ and $P_2$. This adjustment can be made by varying the length of path of transmission of the wave within the liquid medium or by suitable replacement of one cap member by another having a different vertical height. The pressure acting between the thin metal plate 13 and the upper plastic member $P_1$ can be chosen to be quite small. As an example, a titanium plate 50 microns in thickness and 10 mm. in radius was brought into contact with a polyethylene sheet 3 mm. in thickness with a total pressure of 300 grams. It should be noted that this is quite a small value as compared with the pressure employed in the prior art for a metal horn. It must be emphasized here that to carry out the invention successfully, it is essential to apply a layer or film of liquid such as water or oil onto the upper surface of the member $P_1$ so that such liquid layer or film is interposed between the thin metal plate and the surface of the member $P_1$, in order to ensure minimum loss in transmission from the metal plate into the member $P_1$. The reason herefor is believed to be that both plastic plate and the thin metal plate have rough surfaces microscopically so that in the absence of the above liquid layer, the area of contact between them causes a considerable transmission loss.

Upon excitation of the ultrasonic vibrator, the produced ultrasonic wave is propagated through the liquid medium, transmitted by the thin metal plate, absorbed by the plastic plate $P_1$ and forms a focal zone in the surface of contact between the plastic plates $P_1$ and $P_2$, thereby heating and welding together the plates at this surface. Thus by sliding the cradle 22, a continuous weld line is obtained along the surface of contact.

An example is given below which shows the values used or achieved in welding two polyethylene films in the manner just described above.

Vibrator—Barium titanate vibrator having the shape of a sphere of 65 mm. in radius cut to a fraction of 50 mm. in diameter
Frequency—3 mc./s.
High frequency excitation power—20 watts
Focal zone—1.5–2.0 mm. in diameter
Peak energy density in focal zone—10–15 w./mm.$^2$
Thickness of films—3 mm.
Feed rate of films—1 m./min.

In the above description, the flat plastic plates were welded at the surface of face-to-face contact, as illustrated in FIG. 10*a*. However, the above mentioned ultrasonic wave generating and focusing apparatus A is equally applicable for welding plastic members having interengaging stepped ends at such joint (FIG. 10*b*) or for welding them in end-to-end abutment (FIG. 10*c*). In these cases, the apparatus is positioned as indicated in these figures. It may be desirable to apply an external force, as indicated by the arrows, to keep both members in steady engagement or abutment.

In the apparatus shown in FIGS. 2*a*, 2*b* and 3, the vibrator had the shape of a part of a sphere for the purpose of focusing ultrasonic waves. However, the focusing can be achieved in various other ways. FIG. 6 shows one of such alternative ways. In this figure, a planar or flat vibrator 27 is used and the ultrasonic waves produced are reflected by a conical reflector or prism 28 which deflects the waves by 90° laterally to a surrounding mirror 29 having the shape of a part of a paraboloid. The paraboloid mirror 29 is designed to focus the waves to a focal zone below the thin metal plate as shown. In FIG. 7, a planar vibrator 27 is combined with a plano-concave plastic lens. All of these focusing arrangements are examples which may be used to obtain a point focus. FIGS. 8 and 9 illustrates further arrangements for creating a linear or circular focus. The lens 31 shown in FIG. 8 is plano-concave in shape for use with an elongated planar vibrator to produce a linear focus. The lens 32 shown in FIG. 9 may be considered as formed by rounding the lens 31 of FIG. 8 in a circle of a radius which is equal to the width of the lens 31 with its one side constituting the periphery of the circle and its other side an apex at the center of the circle, as will be noted from the section indicated in broken lines in FIG. 9. It will be appreciated that other numerous variations of focusing means may be considered within the skill of one having ordinary knowledge in the art of geometrical optics.

Referring to FIG. 11, there is shown another embodiment of the welding system according to the invention. The system includes a casing 40 in which an ultrasonic wave generating and focusing apparatus as illustrated in FIG. 2*a* is supported in an inverted position on a plate 41 adjustably carried by bolts 42, the latter being engaged with threaded holes in a stool portion 43 of the casing. It will be noted that the vibrator 2 of the focusing apparatus is concave in an upward direction and wave fronts of the ultrasonic frequencies produced which would be concentric spheres are shown in chain lines converging to a focal zone 44 which in this case is a stepped junction between ends of two hollow cylindrical, plastic bodies 45 and 46. It should be noted that in this embodiment, the bodies 45 and 46 are partly immersed in liquid medium 10 contained void-free in the casing so that the junction 44 lies below the level of the liquid medium. The opening at the lefthand end of the plastic body 45 is engaged by a frustoconical support 47 which is journalled by a rod 48 at a bearing 48*a*. The rod 48 slidably extends through an opening 49 provided in one end of a cylinder 50 which is laterally secured to the wall of the casing, and is connected at its other end with a piston 51. A compression spring 52 extends between the piston 51 and the casing wall.

The other plastic body 46 is engaged by another frustoconical support 54 connected with a driving shaft 55 which is supported by and extends through a sleeve 56. The sleeve 56 is secured by bolts to a U-shaped member 57 which is fixed to the casing wall by bolts 58. The shaft 55 extends through an opening 59 formed in the U-shaped member and is fixedly connected with a hub 60 by a set screw 61, the hub 60 being integral with a transmission gear 62 which meshes with a gear 63 mounted on an axle 64 rotatably supported by the U-shaped member 57 at 65 and 66. The free end of the axle 64 is bent in the form of a crank as shown and provides a handle for rotating the axle 64 and the gears 63 and 62 therewith.

In operation, plastic bodies 45 and 46 are mounted in place between the supports 47 and 54 with the stepped junction 44 lying at the focal zone of the focusing apparatus, whereby sufficient pressure is applied by the piston and cylinder assembly 49, 50 including the compression spring 52 to hold both plastic bodies 45 and 46 in steady engagement. Then the ultrasonic vibrator 2 is excited through the cable 14, whereupon the junction 44 is melted and joined together. Operation of the handle at the free end of the axle 64, either manually or automatically as programmed, rotates the support 54 as shown by an arrow, so that a circular weld line is formed along the junction 44. It will be readily understood that various other forms of weld lines can be obtained as desired by suitable design parts which provide movement to the bodies to be worked. It will be noted that with this arrangement, the plastic bodies to be worked are directly in contact with liquid medium at their part which serves to transmit ultrasonic waves to the focal zone in the interior of the bodies, so that a cooling effect is achieved advantageously by the liquid medium. It is believed that this together with insufficient focusing at the body surface explains why surface scars are not formed with the method of the invention.

According to the invention, further advantage is provided by applying a layer or film of liquid between the surfaces of parts to be joined as shown in FIG. 12. Such liquid may be water, alcohol, oils or any other liquid which proves satisfactory as the transmission medium of the ultrasonic waves. Also paste-like materials may be used for this purpose, provided their consistency is such that they well fill the space between the surfaces to be joined. Preferably such liquid layer or film should not contain air bubbles or foams of any other gas, since the latter spoils the very purpose of providing the film or layer which is to achieve a uniform transmission medium between the surfaces to be joined to thereby minimize reflection and transmission loss of the ultrasonic waves. Microscopic examination showed that when a pair of plastic plates were joined at the surface of face-to-face contact, fusion of material dominantly prevailed in one plate, that is, that one through which the ultrasonic wave was transmitted. When a liquid layer was applied between the two plates, fusion of material was observed progressing to the same degree in both plates. The surface of a plastic plate has considerable unevenness when viewed microscopically and where two plates are brought into face-to-face contact, the contact will not be uniform along its length, so that it is considered that the above liquid layer or film applied between the surfaces to be joined serves to eliminate such irregularities, thereby achieving a uniform welding.

While the invention has been described and illustrated with reference to particular embodiments, it should be apparent to those skilled in the art that various modifications are possible within the scope of the invention.

What is claimed is:

1. A method of welding plastic members with ultrasonic waves, comprising the steps of generating an ultrasonic wave of a frequency not lower than 100 kc./s., confining a void-free volume of liquid medium, causing the wave to pass through said liquid medium, focusing the wave through said liquid medium to a focal zone, placing the surfaces to be joined of the plastic members in the focal zone, and causing the wave which passed through said liquid medium to reach said focal zone through an interface between the surface of at least one of the plastic members and liquid medium.

2. A method according to claim 1, wherein said surfaces to be joined are immersed in said liquid medium.

3. A method according to claim 1, further including the step of moving the plastic members, while holding them in engagement, with respect to said focal zone.

4. A method according to claim 1, wherein said liquid medium is confined in a chamber closed by a thin metal plate arranged in the path of transmission of the wave to the focal zone and including the steps of bringing one of the plastic members into contact with the thin metal plate, and applying a film of liquid on the contact surface of the thin metal plate with said one plastic member.

5. A method according to claim 1, further including the step of applying a separate layer of liquid between the surfaces to be joined.

References Cited

UNITED STATES PATENTS 3,131,104 4/1964 Kern ---------------- 156—73

FOREIGN PATENTS 927,050 4/1955 Germany.

OTHER REFERENCES

"Ultrasonics in Industry," E. B. Steinberg, Proceedings of the IEEE, vol. 53, No. 10, October 1965, pp. 1292–1304.

CARL D. QUARFORTH, Primary Examiner

A. J. STEINER, Assistant Examiner

U.S. Cl. X.R.

156—580